Oct. 24, 1961 J. T. WALLMARK ET AL 3,005,937

SEMICONDUCTOR SIGNAL TRANSLATING DEVICES

Filed Aug. 21, 1958 3 Sheets-Sheet 1

INVENTORS
JOHN T. WALLMARK &
HERBERT NELSON
BY J. C. Whittaker
ATTORNEY

INVENTORS
JOHN T. WALLMARK &
HERBERT NELSON
BY J. L. Whittaker
ATTORNEY

Oct. 24, 1961 J. T. WALLMARK ET AL 3,005,937

SEMICONDUCTOR SIGNAL TRANSLATING DEVICES

Filed Aug. 21, 1958 3 Sheets-Sheet 3

INVENTORS
JOHN T. WALLMARK &
HERBERT NELSON
BY J. L. Whittaker
ATTORNEY

United States Patent Office 3,005,937

Patented Oct. 24, 1961

3,005,937

SEMICONDUCTOR SIGNAL TRANSLATING DEVICES

John T. Wallmark and Herbert Nelson, Princeton, N.J., assignors to Radio Corporation of America, a corporation of Delaware Filed Aug. 21, 1958, Ser. No. 756,378
13 Claims. (Cl. 317—235)

This invention relates in general to novel semiconductor signal translating devices and in particular to improved semiconductor devices adapted to be operated in switching circuits.

Switching circuits are used extensively in electronic computers, for example, and may take the form of gates, matrix switches, and the like. Such switching circuits usually include a plurality of interconnected components or stages, each stage including at least one active element such as a vacuum tube, gas tube, or semiconductor device. Conventional switching circuits employing tubes or semiconductor devices such as transistors, are subject to the disadvantage that a plurality of tubes or transistors, as the case may be, as well as interconnecting circuits are required. Because of the large number of components required, the space and weight requirements for such circuits may be large, circuit reliability may be low, and maintenance may be difficult. In digital computer circuits, in particular, switching speed may be low, and if vacuum tubes are utilized, large amounts of heater power may be required.

It is accordingly an object of the invention to provide improved semiconductor switching devices.

Another object is to provide improved semiconductor switching devices adapted to be operated with simplified circuitry.

A further object is to provide improved semiconductor switching devices utilizing unipolar type transistors.

The foregoing objects are accomplished in accordance with the present invention by improved semiconductor devices which comprise a plurality of unipolar transistors fabricated on a single semiconductor wafer.

In accordance with a feature of the invention, a semiconductive body consisting of two opposite conductivity zones separated by a rectifying junction is divided into a plurality of unipolar transistors by a multiplicity of grooves, certain of which extend through a first one of the zones and across the junction and others which extend only partially through one of the zones. Various switching circuit embodiments can be provided by this structure.

In one embodiment of the invention, a particular type of switching or logic network is provided by a plurality of rows of series-connected unipolar transistors, with each of the rows electrically insulated from each other, wherein predetermined switching paths are provided. In another embodiment of the invention a matrix type switching network is provided by a plurality of pairs of series-connected unipolar transistors. In still another embodiment of the invention, a multiple OR-gate and a multiple AND-gate are respectively provided by a plurality of unipolar transistors fabricated so as to provide either a single current path or a plurality of parallel current paths between input and output circuits.

The invention and characteristic embodiments thereof will be described in greater detail by reference to the accompanying drawings wherein similar reference characters are applied to similar elements, and in which.

Figure 3:
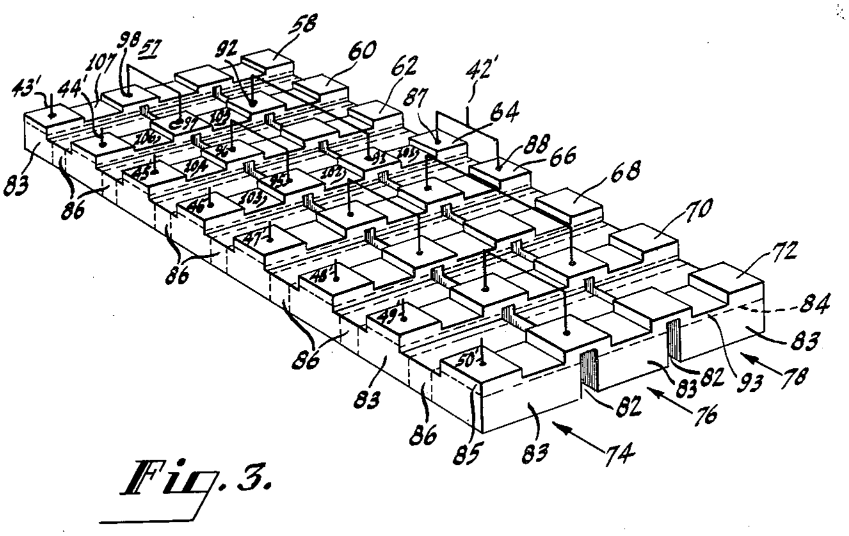
FIGURE 3 is a perspective view of a semiconductor switching device for performing the switching functions of a "tree" in accordance with the invention.
Figures 4A, 4B, 4C, 5, 6A, 6B, 7:
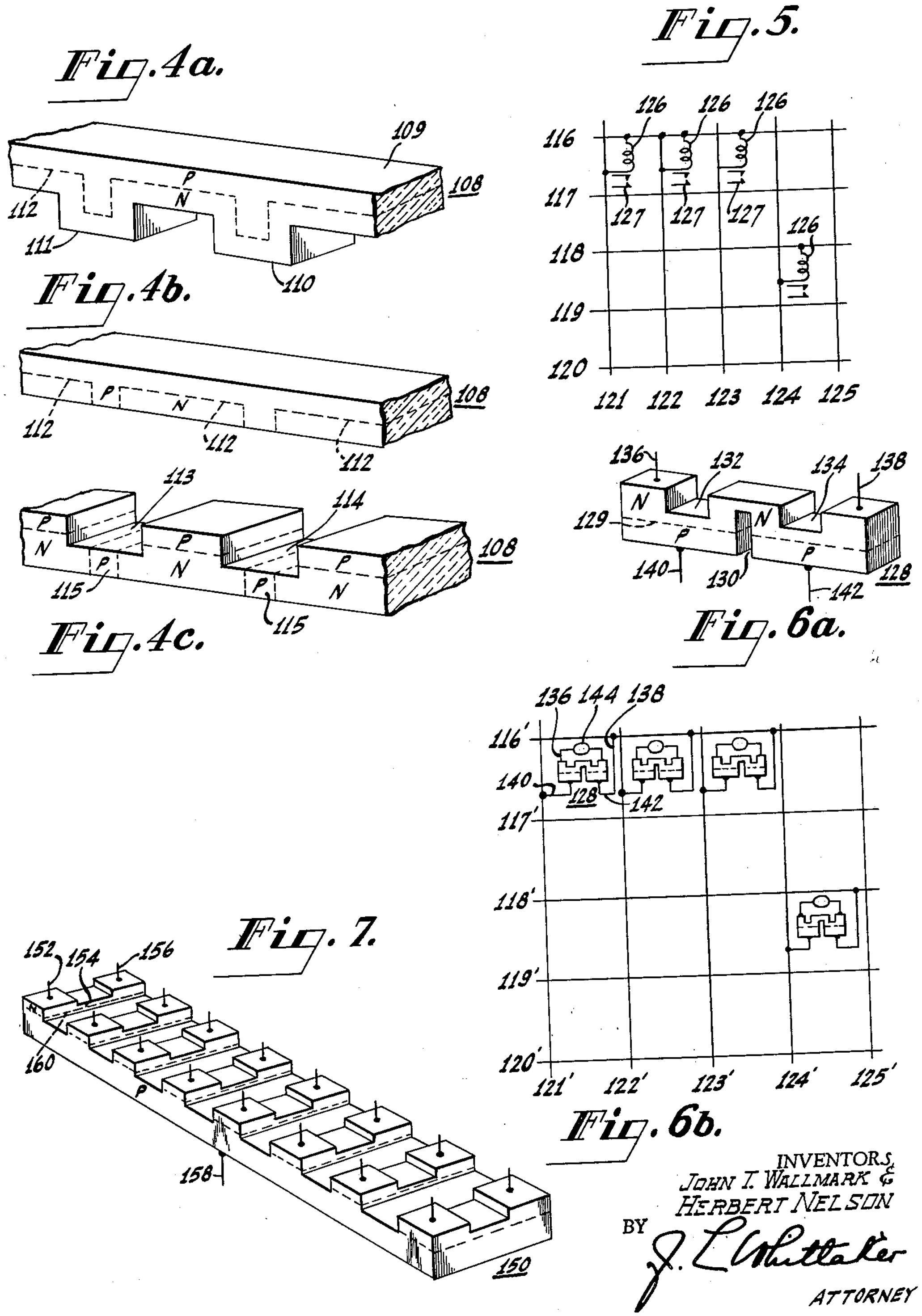
Figure 8:
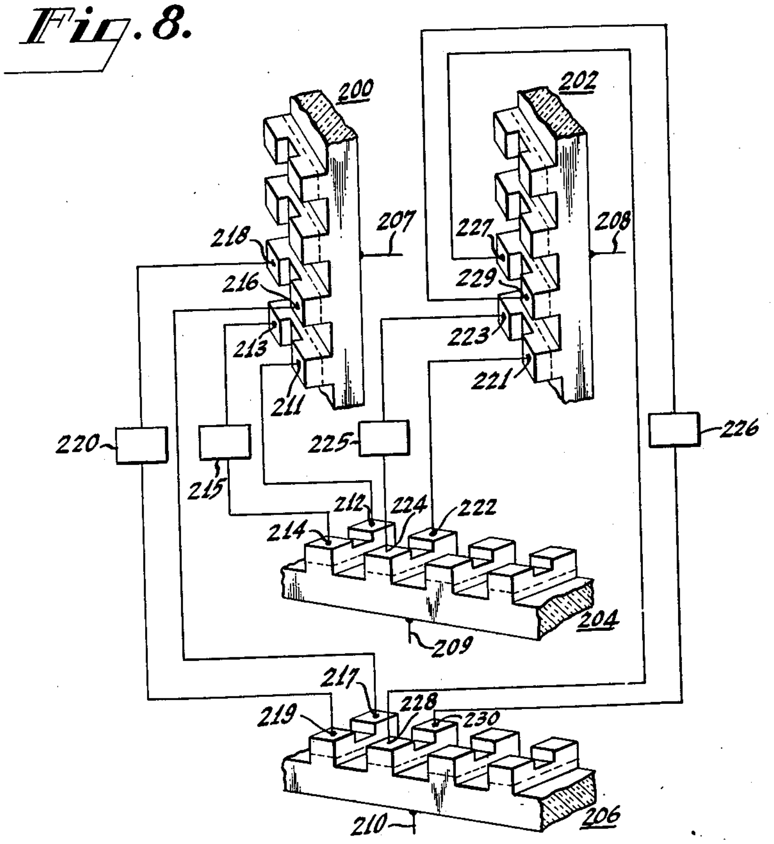
Figure 9:
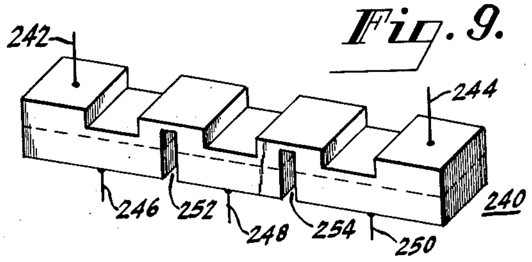
Figure 10:
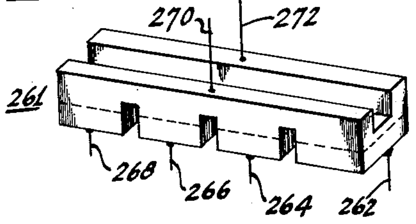

FIGURES 4*a*, 4*b* and 4*c* are perspective views illustrating a method of making the device of FIGURE 3;

FIGURE 5 is a generalized diagram of a matrix switch utilizing electromechanical relays;

FIGURE 6*a* is a perspective view of a unipolar type semiconductor device for use in the matrix switch of FIGURE 5 in accordance with the invention;

FIGURE 6*b* is a diagram of a matrix switch utilizing the device of FIGURE 6*a*, showing the device in elevation view;

FIGURE 7 is a perspective view of another unipolar semiconductor device for use in a matrix switch in accordance with the invention;

FIGURE 8 shows a plurality of the devices of FIGURE 7 in a matrix switching circuit;

FIGURE 9 is a perspective view of a multiple AND-gate in accordance with the invention; and FIGURE 10 is a perspective view of a multiple OR-gate in accordance with the invention.

Figures 1, 2:
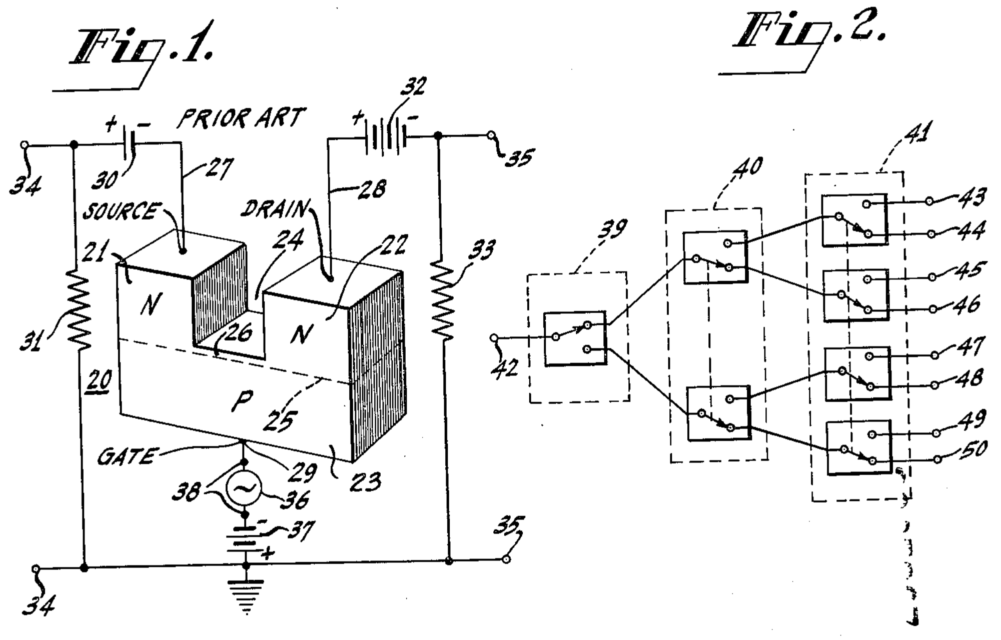
FIGURE 1 is a perspective view of a type of unipolar transistor known in the prior art and showing typical circuit connections.
FIGURE 2 is a block diagram of a general type of switching network called a "tree"

In the embodiment of a prior art type unipolar transistor 20 illustrated in FIGURE 1, the semiconductive body, which may be germanium or other suitable semiconductive material, comprises two N-type zones 21 and 22 contiguous with a P-type zone 23. Such a body may be fabricated for example, by lapping a thin slot or groove 24, say 1 x $10^{-3}$ inches wide, in the N zone of a body containing a PN junction 25. The slot may be substantially rectangular as illustrated or of other form, for example V-shaped. The base of the slot is in immediate proximity to the junction 25, an illustrative spacing of the two being 1 x $10^{-3}$ inches, thereby forming a channel 26 between the N zones 21 and 22. Ohmic connections 27, 28 and 29 are made to the zones 21, 22 and 23 respectively. These connections provide a source, a drain, and a gate electrode.

The unipolar transistor is so called because the "working current" carried by the device is by one type of current carrier, either holes or electrons. A detailed description of such a device may be found in the article "A Unipolar 'Field-Effect' Transistor" by W. Shockley, Proceedings of the IRE, November 1952, pages 1365–1376. The working current flows between the ohmic contacts 27 and 28 connected with the source and drain electrodes respectively. For the N-type semiconductor illustrated, the majority carriers are electrons.

In operation, majority carriers are provided by connecting the source electrode 27 to the negative terminal of a first battery 30 and the positive terminal of the battery is connected through a D.C. return resistor 31 to ground. Operating bias for the drain electrode is provided by connecting the positive terminal of a second battery 32 to the drain electrode 28 and the negative terminal of the second battery is connected through a load resistor 33 to ground. Input signals are applied to a pair of input terminals 34 connected between the positive terminal of the first battery 30 and ground, and output signals are obtained at a pair of output terminals 35 connected between the negative terminal of the second battery 32 and ground. Gate signals are applied to the gate electrode 29 by a signal source 36 connected to gate terminals 38 between the gate electrode and in series with a gate bias battery 37, the positive terminal of which is grounded. The gate battery 37 is shown poled so that, in the absence of a gate signal, no current will flow between the source and drain electrodes.

In one type of switching circuit operation, the gate electrode 29 reverse biases the PN junction 25. A PN junction is reverse biased when the P-type region is made negative with respect to the N-type region. A depletion layer is thereby formed at the junction extending into the channel 26. If the reverse bias voltage of the gate bias battery 37 is high enough, the depletion layer at the PN junction becomes thick enough to "pinch off" the current path through the channel 26 through which the working current flows. If the gate bias voltage is now reduced, the channel will open and current will flow between the source and the drain electrodes. The unipolar transistor can therefore function as a switch. Although the device may be turned on and off it is not bistable per se. That is, the channel 26 will be either conducting or non-conducting only as long as the proper polarity signal voltage is applied to the gate electrode 29. A description of techniques for making such transistors may be found in the article "The Preparation of Semiconductor Devices by Lapping and Diffusion Techniques" by H. Nelson, Proceedings of the IRE, June, 1958, pages 1062–1067.

The unipolar transistor, as described, may be embodied in a number of devices to provide various types of useful switching circuits. For example, FIGURE 2 illustrates a logic circuit called a "tree" which may be constructed of such unipolar transistors. FIGURE 2, in block form, illustrates the type of switching network provided by a "tree." This network comprises three single pole-double throw switches 39, 40 and 41, with the switches 40 and 41 having a plurality of ganged sections. A terminal 42 connected to the pole of switch 39 comprises the input terminal, and terminals 43 through 50 connected to switch 41 comprise the output terminals. A signal path from the terminal 42 to any one of the terminals 43 through 50, terminal 46 for example, is provided by setting the switches 39, 40 and 41 to the positions shown. However, any of the terminals 43 through 50 may be connected one at a time to terminal 42 by proper setting of the switches 39, 40 and 41. The number of output terminals increases by $2^n$ for each additional switch added in cascade, where $n$ is the total number of switches.

A typical use of such an element is for address selection in a large computer memory. When a number stored in a frame in a memory matrix of a computer is needed in the arithmetic unit, the proper address signal is sent to the "tree." The address signal serves to set the switches 39, 40 and 41 to one of their two possible positions to select a single frame in the memory, each frame being connected to one of the output terminals of the "tree." In reality much larger "trees" than the one shown in FIGURE 2 are usually necessary.

Switching schemes of this type have heretofore been obtained by using elements such as transistors, electron tubes, etc., and their interconnecting circuitry in place of the switches. The device shown in FIGURE 3 achieves the same results as the "tree" and in a unitary structure in accordance with the invention. This figure shows a device 57 provided with eight columns 58, 60, 62, 64, 66, 68, 70 and 72 of three rows 74, 76 and 78 of series-connected unipolar transistors. These transistors are of the type heretofore shown in FIGURE 1. Each transistor includes a gate region 83 separated from source and drain electrodes by a PN junction 84. The source and drain electrodes in each transistor are joined by a channel such as is illustrated at 93 for a transistor in column 72. This channel functions in the same manner as the channel 26 heretofore discussed in connection with FIGURE 1. Each of the rows 74, 76 and 78 is separated from the rows adjacent thereto by a groove or notch 82 extending through a gate region 83 and substantially beyond the PN junction 84. Three series-connected unipolar transistors are thus formed in each column. The middle transistors, corresponding to those in row 76, thus have their source and drain electrodes in common with the drain and source electrodes respectively of adjacent transistors in rows 74 and 78.

Isolation between columns is provided by introducing impurities into the semiconductor body to form a plurality of regions 86, of opposite type conductivity to the gate regions, between the columns. Assume, for example, that the gate regions 83 are N-type, and the source and drain regions 85 are P-type. Then the regions 86 are made P-type to form a high impedance rectifying junction at each of the adjacent N-type gate regions, thereby effectively providing electrical isolation between the columns. A method for producing such a structure will be described hereinafter.

Gate electrodes (not shown) are connected to the gate regions of each of the unipolar transistors. Contacting electrodes are attached to each of the P-type source and drain regions. For clarity only certain of these connections are shown. Output terminals 43′ through 50′ are provided in row 74, and correspond to the terminals 43 through 50 of FIGURE 2.

To obtain the same type of switching action as previously described for FIGURE 2, it is now necessary to add certain external wire connections to the device 57 of FIGURE 3. In the two unipolar transistor units corresponding to the intersection of row 78 and columns 64 and 66, a pair of ohmic contact terminals 87 and 88 are provided on the source electrodes and are directly interconnected. An input terminal 42′ is connected to both of these terminals. The prime numbered terminals, 42′ to 50′ of FIGURE 3, correspond to the unprimed terminals in FIGURE 2.

In operation, it is required that an input signal applied to the terminal 42′ be capable of being switched to any one of the output terminals 43′ to 50′ by applying the proper polarity voltages to the gate electrodes (not shown) in the structure 57. For example, suppose it is desired to interconnect the terminal 42′ with the terminal 46′ located in column 64. This corresponds with the shown setting of the switches in the "tree" of FIGURE 2. By applying a positive voltage to the gate electrodes (not shown) under each of the channels 101, 102 and 103 all the channels in column 64 will become conductive and a complete signal path will exist from terminal 42′ to terminal 46′.

Suppose now that it is desired to interconnect terminals 42′ and terminal 45′. To do this, the channels 101 and 102 again are made conductive. A conductive path will then exist from the terminal 42′ to an ohmic contact terminal 95 connected to the unit corresponding to the intersection of row 76, column 64. But terminal 45′ is in column 60. Since adjacent columns are each electrically isolated by the regions 86, an external connection must be provided between columns 60 and 62. This is achieved by providing an ohmic contact 96 on the unit corresponding to the intersection of row 76, column 62, and directly connecting the terminals 95 and 96. Now if channel 104 is made conductive, a complete path will exist between the terminal 42′ and 45′.

Assume now it is desired to interconnect the terminals 42′ and 44′. Following similar reasoning, it is seen that a direct connection between columns 64 and 60 is required. This is achieved by directly connecting a terminal 91 in column 64 and a terminal 92 in column 60. A positive voltage is applied to the gate electrode under channels 101, 105 and 106. A conductive path then exists from terminal 42′ through channel 101, through terminals 91 and 92, through channels 105 and 106 and then to terminal 44′.

As a last example, assume it is desired to interconnect terminals 42′ and 43′. It is apparent that a conductive path must be provided between columns 64 and 58. However, a path already exists between columns 64 and 60, and it is therefore only necessary to provide a direct connection between the columns 58 and 60. A terminal 97 in column 60 is therefore directly connected with a terminal 98 in column 58. If channels 101, 105 and 107 are now made conductive, a complete path will exist between the terminals 42′ and 43′. It is to be noted that in all cases only three channels need be made conductive, corresponding to the setting of the three switches 39, 40 and 41 of FIGURE 2.

Since that portion of the device 57 to the left of column 64 is symmetrical with that portion to the right of column 66, then the same type of external interconnections are provided in the remainder of the device to complete the structure.

It is to be noted that the external interconnections are made so that a single current path exists from the input terminal 42′ to each one of the output terminals 43′ to 50′. The current path is a single path through uninterrupted semiconductor material, not crossing any junction connections. There is no problem with differences of direct current potential levels, as might be the case if separate switching elements were utilized. The proper external connections are shown for a device having eight columns. A different arrangement of external connections would be required for a device having a different number of columns, but the method of establishing the route of these connections remains unchanged.

In actual practice, the external interconnections may be applied by well known printed circuit techniques directly to the semiconductor material. If necessary, an insulating coating, for example an oxide, may be applied first to insulate the interconnecting leads from the wafer.

FIGURES 4*a*, 4*b* and 4*c* illustrate the steps in making the semiconductor "tree." FIGURE 4*a* is an elevation perspective view of a portion of a semiconductor wafer 108 having one plane surface 109, and another surface on which two plateaus 110 and 111 are provided, by etching or lapping, for example. Assume the wafer 108 is P-type. A PN junction 112 is introduced into the wafer by masking the surface 109 and diffusing into the other opposite surface N-type producing elements. The plateaus 110 and 111 are now lapped off leaving the structure of FIGURE 4*b*. In FIGURE 4*c* grooves 113 and 114 have been lapped or etched into the structure at a predetermined spacing and at a depth extending just below the PN junction 112. By this method the P-type isolating or insulating areas 115 are formed between the columns of unipolar transistors. Only a single row structure is shown for illustrative purposes, but the same method applies to making multiple row structures.

Referring now to FIGURE 5, a generalized diagram of a matrix switch is illustrated. The matrix is composed of an array of horizontal busses 116 through 120 and vertical busses 121 through 125 to which a plurality of relay coils 126 are connected. In each relay coil 126, one terminal is connected to a horizontal bus and one terminal is connected to a vertical bus. For illustrative purposes, only four relays are shown, whereas sixteen relays are required to complete the matrix. Relay contacts 124 are shown symbolically next to their associated relay coils. To energize a single relay, a pair of horizontal and vertical busses must be energized. Any desired relay may be energized by applying a voltage to the proper pair of vertical and horizontal busses. This matrix switch may be used in the same manner as the "tree" to select a desired frame from a computer memory system, for example.

It is possible to replace the mechanical relays, in accordance with the invention, by a unipolar transistor structure 128 of the type shown in FIGURE 6*a*. In the device 128, two unipolar transistors of the type shown in FIGURE 1, are, in effect, integrated or combined on a single semiconductor wafer. The wafer includes a single PN junction 129 which is separated into two sections by a notch or groove 130. Additional grooves 132 and 134 are etched or lapped into the N-type material to provide the two unipolar transistors. Electrodes 136, 138, 140 and 142 are ohmically connected to the device. The electrodes 136 and 138 operate as the source and drain electrodes respectively, and each of the two electrodes 140 and 142 function as gate electrodes. It is to be understood that the conductivity types may be reversed if desired.

FIGURE 6*b* shows how the mechanical relays may be replaced by the device 128. The primed numbers in this figure correspond to the unprimed numbers in FIGURE 5. The unipolar device 128 has one gate electrode 140 connected to the vertical bus 115 and the other gate electrode 142 connected to the horizontal bus 110. A utilization circuit 144 is connected between the source electrode 136 and the drain electrode 138. Additional unipolar devices are similarly connected to the remaining vertical and horizontal busses in the matrix, but for illustrative purposes only four are shown. Operating potentials are applied to the devices in the same manner as shown for the unipolar transistor in FIGURE 1.

Assuming the unipolar devices of FIGURE 6*b* are of the same conductivity type as the device of FIGURE 6*a*, then a negative bias voltage applied to each vertical and horizontal bus will pinch off the conducting channels, and no current will flow between the source and the drain electrodes. This is equivalent to an open relay. If now the vertical bus 115 and a horizontal bus 115 are pulsed positively, the unipolar device 128 will become conductive between the source and drain electrodes, thereby switching the utilization circuit 144. Any other utilization circuit in the matrix may be similarly switched by pulsing the proper pair of vertical and horizontal busses.

Another device and a method of providing a matrix switch in accordance with the present invention is illustrated in FIGURES 7 and 8. FIGURE 7, shows a device 150 in which a plurality of unipolar transistors are assembled on a single semiconductor body. Eight unipolar transistors are shown, however any number may be used on a single structure depending on the size of the matrix switch desired. Each of the unipolar transistors has its own individual source 152-channel 154-drain 156-current path. A gate electrode 158 is common to all the transistors on the structure.

A device of this type may be simply made by diffusing onto one surface of a semiconductor wafer of one type conductivity an impurity which forms an opposite type conductivity. A rectifying junction 160 is thus formed. By etching or lapping for example, a longitudinal notch is provided which penetrates the N-type surface to provide a channel 154. A plurality of transverse grooves which penetrate below the junction and into the P-type gate region provide a plurality of individual unipolar transistors with a common gate region.

The matrix switch of FIGURE 5 can now be assembled from a plurality of the devices 150, wherein each vertical bus and each horizontal bus is composed of one of these units. FIGURE 8 shows such an arrangement. The units 200 and 202 serve as vertical busses and the units 204 and 206 serve as horizontal busses. Two pairs of busses are shown for clarity. Switching signals are applied to gate electrodes 207, 208, 209 and 210 connected respectively with the unipolar devices 200, 202, 204 and 206.

To perform the functions of a matrix switch, the source-channel-drain current path of each unipolar transistor unit in the vertical bus is connected in series with a corresponding source-channel-drain current path in the unipolar transistor unit in the horizontal bus, and a utilization circuit to be switched is inserted in this series path. For example, in the unit 200 and 204, source electrode 211 in unit 200 and source electrode 212 in unit 204 are directly connected and drain electrodes 213 in unit 200 and 214 in unit 204 are connected to a utilization circuit 215. In a similar manner in units 200 and 206 the source electrodes 216 and 217 are directly connected, and drain electrodes 218 and 219 are connected to another utilization circuit 220. This type of interconnection, in which a utilization circuit is connected in a series current path between the source and drain electrodes in a pair of unipolar transistors is repeated throughout the circuit. Source electrodes 221 and 222 in units 202 and 204 are directly connected and drain electrodes 223 and 224 are each connected with utilization circuit 225. For purposes of clarity only one other utilization circuit 226 is shown. This circuit is connected between drain electrodes 227 and 228 in units 202 and 206. In addition, the source electrodes 229 and 230 in these units are directly connected. Operating voltages are applied in the same manner as shown for the single unipolar transistor of FIGURE 1.

In operation, to switch any one of utilization circuits a positive voltage must be applied to the gate electrodes of the two unipolar devices between which the utilization circuit is connected. For example, to switch the utilization circuit 220 it is necessary to apply a positive voltage to the gate electrodes 207 and 210. This voltage opens all the channels in the unipolar devices 200 and 206. However, only the utilization circuit 220 is connected in common with these units and hence will be the only one that is switched. It is therefore apparent that this circuit operates in the same manner as the matrix switch circuits discussed heretofore.

FIGURE 9 illustrates still another circuit device 240 constructed in accordance with a feature of the present invention. The device is similar to that previously described in FIGURE 6*a*, with the exception that three series connected unipolar transistors are shown. In this case, as many series connected units may be provided as are required for any particular application. The device 240 includes a source electrode 242, a drain electrode 244 and three gate electrodes 246, 248 and 250. Grooves or notches 252 and 254 provide individual unipolar transistors.

The device operates as a multiple AND-gate, such as may be in digital computers, for example. The gate electrodes 246, 248 and 250 correspond to input electrodes to which are applied pulses of common polarity. A single current path between the source electrode 242 and the drain electrode 244 is present. An output signal will be obtained at the drain electrode 244 only if a pulse is applied simultaneously to each of the gate electrodes of a polarity to cause the channels to be conductive. No output currents can flow if any conductive channel is open.

FIGURE 10 illustrates yet another semiconductor circuit device 261 constructed in accordance with a feature of the invention. This structure is intended for use in a multiple OR-circuit, in a digital computer for example. The structure 261 includes a plurality of parallel connected unipolar transistors. The OR-circuit is basically a buffer or mixing circuit which permits a number of pulse sources of common pulse polarity to be connected to a common load. The circuit has a plurality of inputs corresponding to gate electrodes 262, 264, 266 and 268 and a single input-output current path comprising a source electrode 270 and a drain electrode 272. If a pulse is applied to any one or more of the inputs, a pulse appears between the source and drain electrodes. The circuit derives its name from the fact that an output pulse appears between the source and drain electrodes when a pulse is applied at any of the input electrodes 262, 264, 266 or 268.

There have thus been shown and described a number of novel semiconductor devices, all of which may be fabricated from a particular type of unipolar transistor structure. These devices permit simplification of complex circuitry by incorporating many circuit functions within a single semiconductor structure.

What is claimed is:

1. A circuit element comprising a body of semi-conductive material including a first zone of one conductivity type forming a junction with a second zone of different conductivity type, a plurality of grooves disposed in said body, at least one of said grooves extending through one of said zones and across said junction and another of said grooves extending only partially through one of said zones and spaced from said junction, said junction and said other groove defining a channel for the unipolar flow of charge carriers.

2. A circuit element comprising a body of semi-conductor material including a first zone of one conductivity type material forming a junction with a second zone of opposite conductivity type material, means dividing said body into a plurality of unipolar type transistors, said means comprising a first plurality of grooves formed in said first zone and extending beyond said junction and another plurality of grooves extending only partially through said second zone and located intermediate said first plurality of grooves, said second plurality of grooves defining source and drain electrodes in each of said transistors with a channel therebetween for controlling the flow of charge carriers between said electrodes.

3. A circuit element comprising a body of semi-conductor material including a first zone of one conductivity type material forming a junction with a second zone of opposite conductivity type material, means dividing said body into a plurality of unipolar type transistors, said means comprising a plurality of grooves formed in said first zone and extending beyond said junction and another groove extending only partially through said second zone and in a direction substantially perpendicular to said plurality of grooves.

4. A circuit element comprising a body of semi-conductive material including a first zone of one conductivity type material forming a junction with a second zone of opposite conductivity type material, means comprising a plurality of grooves disposed in said semiconductor body dividing it into a plurality of rows and columns of unipolar transistors, and means electrically isolating said columns.

5. A circuit element comprising a body of semi-conductivity material including a first zone of one conductivity type material forming a junction with a second zone of opposite conductivity type material, means comprising a plurality of grooves disposed in said semiconductor body dividing it into a plurality of rows and columns of unipolar transistors, means electrically isolating said columns, and external means electrically associating said unipolar transistors into a network of predetermined configuration comprising conductors connecting certain terminals of said unipolar transistors.

6. A circuit element comprising a body of semiconductive material including a first zone of one conductivity type forming a junction with a second zone of opposite conductivity type, means dividing said body into a plurality of unipolar type transistors, said means comprising a plurality of grooves, at least one of said grooves extending through one of said zones and across said junction and at least one other of said grooves extending only partially through the other of said zones and spaced from said junction, said other groove and said junction defining a channel for the unipolar flow of charge carriers, and each of said unipolar transistors having a source, a gate and a drain electrode ohmically connected thereto.

7. A circuit element comprising a body of semiconductive material including a first zone of one conductivity type forming a junction with a second zone of opposite conductivity type, and means dividing said body into a plurality of unipolar type transistors, said means comprising a plurality of grooves, at least one of said grooves extending through one of said zones and across said junction and another of said grooves extending only partially through said one of said zones and spaced from said junction, said other groove and said junction defining a channel for the unipolar flow of charge carriers, each of said unipolar transistors having source and drain electrodes ohmically connected thereto, and a common gate electrode ohmically connected to said body.

8. A circuit element comprising a body of semiconductive material including a first zone of one conductivity type forming a junction with a second zone of opposite conductivity type, a first plurality of grooves formed in said second zone and extending into said semiconductor body whereby said rectifying barrier is divided into a plurality of discrete junction areas, and a second plurality of grooves formed in said second zone in a direction substantially perpendicular to said first plurality of grooves and extending only partially through said second zone whereby a plurality of discrete plateau areas are formed in said second zone and a plurality of unipolar transistors are thus provided, a pair of ohmic contact connections to said second zone near opposite ends of each of said junctions, and a single ohmic contact to said body of semiconductor material.

9. In combination, a semiconductor body including a first zone of one conductivity type and a second zone of opposite conductivity type contiguous with said first zone and forming a rectifying junction therebetween, a first plurality of spaced-apart grooves formed in said first zone and extending beyond said rectifying junction, a second plurality of grooves formed in said second zone and extending only partially through said second zone, said second plurality of grooves being spaced intermediate said first plurality of grooves, source and drain connections to said second zone spaced apart therealong near opposite ends of said rectifying junction, and a plurality of gate connections to said first zone with one gate connection opposite each of said second grooves.

10. A circuit element comprising a body of semiconductive material including a first zone of one conductivity type forming a junction with a second zone of opposite conductivity type, a plurality of grooves formed in said semiconductor body and extending into said second zone of opposite conductivity type material whereby a plurality of junctions are formed, and another plurality of grooves formed in said block of semiconductor material and extending only partially through said body and with said junctions defining a channel for controlling the flow of charge carriers between adjacent portions of said body.

11. A circuit element comprising a body of semiconductive material including a P-type region and an N-type region separated by a rectifying junction, means providing a first plurality of grooves in said P-type region extending substantially beyond said junction, means providing a second plurality of grooves in said N-type region intermediate said first plurality of grooves and extending only partially through said N-type region whereby a plurality of unipolar transistors are formed, electrode means ohmically connected to said P-type region intermediate said first plurality of grooves, and electrode means connected to said N-type region at extreme opposite ends of said rectifying junction.

12. A circuit element comprising a body of semiconductive material including a first zone of one conductivity type forming a junction with a second zone of opposite conductivity type, a plurality of grooves formed in said semiconductor block and extending into said second zone of opposite conductivity type material whereby a plurality of junctions are formed, a single groove extending only partially through said second zone and substantially perpendicular to said plurality of grooves whereby a plurality of unipolar transistors are formed, source and drain electrode connections connected to said second zone, and a gate electrode connection connected to said body of semiconductor material opposite each said junction.

13. The circuit element of claim 4 wherein said means electrically isolating said columns includes a junction.

References Cited in the file of this patent

UNITED STATES PATENTS

| | | |
|---|---|---|
| 2,663,830 | Oliver | Dec. 22, 1953 |
| 2,667,607 | Robinson | Jan. 26, 1954 |
| 2,748,041 | Leverenz | May 29, 1956 |
| 2,810,081 | Elliott | Oct. 15, 1957 |
| 2,864,961 | Lohman | Dec. 16, 1958 |
| 2,911,539 | Tanenbaum | Nov. 3, 1959 |